United States Patent
Shinohara

(10) Patent No.: US 9,202,957 B2
(45) Date of Patent: Dec. 1, 2015

(54) PHOTOELECTRIC CONVERTER DEVICE AND METHOD FOR ITS MANUFACTURE

(75) Inventor: Wataru Shinohara, Ogaki (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 58 days.

(21) Appl. No.: 13/601,523

(22) Filed: Aug. 31, 2012

(65) Prior Publication Data

US 2012/0325315 A1   Dec. 27, 2012

Related U.S. Application Data

(63) Continuation of application No. PCT/JP2011/077332, filed on Nov. 28, 2011.

(30) Foreign Application Priority Data

Nov. 30, 2010 (JP) ................. 2010-267015
Mar. 9, 2011 (JP) ................. 2011-051554
Jul. 26, 2011 (JP) ................. 2011-163188

(51) Int. Cl.
| | |
|---|---|
| H01L 31/00 | (2006.01) |
| H01L 31/048 | (2014.01) |
| C03C 27/08 | (2006.01) |
| C03C 27/10 | (2006.01) |

(52) U.S. Cl.
CPC ............ *H01L 31/0488* (2013.01); *C03C 27/08* (2013.01); *C03C 27/10* (2013.01); *Y02E 10/50* (2013.01)

(58) Field of Classification Search
USPC ................................ 136/244, 259
See application file for complete search history.

(56) References Cited

U.S. PATENT DOCUMENTS

| | | | | |
|---|---|---|---|---|
| 4,686,321 A | * | 8/1987 | Kishi | ............ 136/244 |
| 5,656,186 A | | 8/1997 | Mourou et al. | |
| 7,371,961 B2 | | 5/2008 | Hikosaka et al. | |
| 2003/0010378 A1 | | 1/2003 | Yoda et al. | |
| 2005/0115603 A1 | | 6/2005 | Yoshida et al. | |
| 2005/0174039 A1 | | 8/2005 | Nishikawa et al. | |
| 2005/0255618 A1 | * | 11/2005 | Kiyomiya et al. | ............ 438/26 |
| 2006/0269731 A1 | | 11/2006 | Yoshikawa et al. | |
| 2008/0041434 A1 | * | 2/2008 | Adriani et al. | ............ 136/244 |
| 2009/0064717 A1 | * | 3/2009 | Son et al. | ............ 65/42 |

(Continued)

FOREIGN PATENT DOCUMENTS

| | | |
|---|---|---|
| CN | 1652644 A | 8/2005 |
| JP | 09511688 A | 11/1997 |

(Continued)

OTHER PUBLICATIONS

JP2004-172048, Machine Translation, Nov. 2002, Matsui.*

(Continued)

*Primary Examiner* — Devina Pillay
(74) *Attorney, Agent, or Firm* — Ditthavong & Steiner, P.C.

(57) ABSTRACT

A photoelectric converter device includes a front surface glass plate, a photoelectric conversion unit formed on the front surface glass plate and serving to generate electric power in response to incidence of light, and a back surface glass plate arranged so as to cover the photoelectric conversion unit. The front surface glass plate and the back surface glass plate are fused and joined in at least a part of a peripheral portion of the glass plates.

16 Claims, 8 Drawing Sheets

(56) References Cited

U.S. PATENT DOCUMENTS

| | | |
|---|---|---|
| 2009/0142984 A1* | 6/2009 | Logunov et al. ............. 445/25 |
| 2009/0173385 A1* | 7/2009 | Kost et al. ................. 136/259 |
| 2009/0194147 A1* | 8/2009 | Grommesh et al. ........ 136/251 |
| 2009/0242017 A1* | 10/2009 | Yasuda ..................... 136/252 |
| 2010/0043871 A1* | 2/2010 | Xia et al. ................... 136/251 |
| 2010/0059102 A1 | 3/2010 | Yagiura et al. |
| 2010/0275992 A1 | 11/2010 | Watanabe |
| 2011/0037383 A1 | 2/2011 | Logunov et al. |
| 2012/0012162 A1 | 1/2012 | Kobayashi |
| 2012/0325315 A1 | 12/2012 | Shinohara |
| 2013/0098447 A1 | 4/2013 | Obinata et al. |

FOREIGN PATENT DOCUMENTS

| | | | |
|---|---|---|---|
| JP | 2001-319775 A | 11/2001 | |
| JP | 2001-326372 A | 11/2001 | |
| JP | 2004-172048 * | 11/2002 | ............ H01M 14/00 |
| JP | 2003-026455 A | 1/2003 | |
| JP | 2003282900 A | 10/2003 | |
| JP | 2004292247 A | 10/2004 | |
| JP | 2005-158801 A | 6/2005 | |
| JP | 2005183546 A | 7/2005 | |
| JP | 2005-209413 A | 8/2005 | |
| JP | 2005235851 A | 9/2005 | |
| JP | 2006-352044 A | 12/2006 | |
| JP | 2007-026883 * | 2/2007 | ............ H01M 14/00 |
| JP | 2007-048674 * | 2/2007 | ............ H01M 14/00 |
| JP | 2007-227260 * | 9/2007 | ............ H01M 14/00 |
| JP | 2008288547 A | 11/2008 | |
| JP | 2009-245705 A | 10/2009 | |
| JP | 2011254116 A | 12/2011 | |
| WO | WO 9527587 A1 | 10/1995 | |
| WO | 2009/073102 A2 | 6/2009 | |
| WO | 2010/122856 A1 | 10/2010 | |
| WO | 2012002422 A1 | 1/2012 | |
| WO | 2012073868 A1 | 6/2012 | |

OTHER PUBLICATIONS

JP2007-026883, Takaguchi, Machine Translation, Feb. 2007.*
JP2007-048674, Ezaki, Machine Translation, Feb. 2007.*
JP2007-227260, Higuchi, Machine Translation, Sep. 2007.*
International Search Report for International Application No. PCT/JP2011/077332, dated Dec. 27, 2011, 5 pages.
Written Opinion for International Search Report regarding International Application No. PCT/JP2011/077332, dated Dec. 27, 2011, 3 pages.
Notification of First Office Action for corresponding Chinese Application No. 201180011890.0 dated Jul. 1, 2014, with partial English Translation, 10 pages.
Forms PCT/IB/338, PCT/IB/373, PCT/ISA/237 and PCT/IB/326, issued in PCT/JP2013/001215, with English translations, 15 Pages.
International Search Report issued in PCT/JP2013/001215, dated Apr. 9, 2013, 3 Pages.
US office action for related U.S. Appl. No. 14/527,516, dated Jun. 4, 2015, 14 Pages.

* cited by examiner

200

300

300

300

US 9,202,957 B2

PHOTOELECTRIC CONVERTER DEVICE AND METHOD FOR ITS MANUFACTURE

CROSS-REFERENCE TO RELATED APPLICATIONS

The present application is a continuation application of International Application No. PCT/JP2011/077332, filed Nov. 28, 2011, the entire contents of which are incorporated herein by reference and priority to which is hereby claimed. The PCT/JP2011/077332 application claimed the benefit of the dates of earlier filed Japanese Patent Applications No. 2010-267015 filed Nov. 30, 2010, No. 2011-051554 filed Mar. 9, 2011, and No. 2011-163188 filed Jul. 26, 2011, the entire contents of which are incorporated herein by reference, and priority to which is hereby claimed.

BACKGROUND

1. Technical Field

The present invention relates to a photoelectric converter device and a method for its manufacture.

2. Related Art

In an electric power generation system using solar light, a photoelectric conversion panel formed by laminating an amorphous, microcrystalline, or other semiconductor thin film is used. When such a photoelectric conversion panel is applied to a solar power generation system, the panel is installed as a photoelectric converter device (module) having a module frame member attached to the outer periphery thereof.

FIGS. 12 to 14 show example structures generally used for a photoelectric converter device (module). FIG. 12 shows a super straight structure used for a thin-film solar cell such as a thin-film silicon solar cell, and FIG. 13 shows a super straight structure used for a monocrystalline or polycrystalline silicon solar cell. In these structures, a photoelectric conversion panel 100 is sealed by a glass plate (glass substrate) 10 and a sealant 12, and, on the sealant 12 side, a back sheet 14 having a metal thin film or the like for preventing ingress of moisture and the like during outdoor use is further overlapped. In addition, on the outer periphery of the photoelectric conversion panel 100, an end face seal 16 is provided for preventing ingress of moisture and the like from the end faces and for preventing breakage, and a module frame member 18 is provided further on the outside for reinforcement.

FIG. 14 shows an example of a glass package structure. In this structure, the above-described back sheet 14 is replaced with a glass plate 20. Further, at each of the end faces of the photoelectric conversion panel 100, an end face seal 22 is filled between the glass plate 10 on the front surface side and the glass plate 20 on the back surface side so as to prevent ingress of moisture and the like.

Meanwhile, U.S. Pat. No. 5,656,186 discloses a technique of welding glass components to each other by radiating a laser beam having a pulse width of the order of femtoseconds.

In the case of a super straight structure, when outdoor use is continued over a long period of time, there are risks that moisture and the like may penetrate and ingress through the back sheet 14 and the sealant 12. Further, ingress of moisture and the like from the end faces may cause failures such as output degradation and line disconnection. Changes in outer appearance may also result due to peeling of films and the like. If long-term reliability of this structure is to be improved, enhancements must be made in the characteristics of the sealing members, and the amount of use of the sealing members must also be increased, leading to higher costs.

In the case of a glass package structure, as it is very difficult to prevent ingress of moisture and the like from the end faces, a special end face seal must be employed, such that increased costs are required. Further, in the case of a structure that does not use the module frame member 18, as the sealant 12 softens under high temperatures during the summer season, there are risks that the relative positions of the glass plate 10 and the glass plate 20 may become shifted.

On the back surface side of the photoelectric conversion element formed on the front surface glass plate 10, there are arranged components such as collector wiring lines for collecting and extracting electric power to the outside of the photoelectric converter device, and also insulating sheathing material for insulating between the collector wiring lines and the back surface electrode of the photoelectric conversion element. Accordingly, a gap is created between the front surface glass plate 10 and the back surface glass plate 20. When air remains inside this gap, expansion and contraction of the air occur due to solar radiation and the like, such that risks of breakage of the glass plates 10, 20 and water ingress via the gap arise.

Meanwhile, if the glass plate 10 and the glass plate 20 are fixed to each other while applying pressure so as to minimize the gap, stress would be applied to the glass plate 20 due to the convexity of the back-surface structures of the photoelectric conversion element, possibly causing breakage.

SUMMARY

According to one aspect of the present invention, there is provided a photoelectric converter device comprising a front surface glass plate, a photoelectric conversion unit formed on the front surface glass plate and serving to generate electric power in response to incidence of light, and a back surface glass plate arranged so as to cover the photoelectric conversion unit. The front surface glass plate and the back surface glass plate are fused and joined in at least a part of a peripheral portion of the glass plates.

According to one aspect of the present invention, there is provided a method for manufacturing a photoelectric converter device. The method includes a first step of forming, on a front surface glass plate, a photoelectric conversion unit serving to generate electric power in response to incidence of light, and a second step of arranging a back surface glass plate to cover the photoelectric conversion unit and fusing and joining the front surface glass plate and the back surface glass plate in at least a part of a peripheral portion of the glass plates.

According to one aspect of the present invention, there is provided a photoelectric converter device comprising a front surface glass plate, a photoelectric conversion unit formed on the front surface glass plate and serving to generate electric power in response to incidence of light, a back surface glass plate arranged so as to cover the photoelectric conversion unit, and a sealant composed of a silicon oxide material and filling at least a part of a gap present between the front surface glass plate and the back surface glass plate. The front surface glass plate and the back surface glass plate are fused and joined in at least a part of a peripheral portion of the glass plates.

According to one aspect of the present invention, there is provided a photoelectric converter device comprising a front surface glass plate, a photoelectric conversion unit formed on the front surface glass plate and serving to generate electric power in response to incidence of light, and a back surface glass plate arranged so as to cover the photoelectric conver- sion unit. The front surface glass plate and the back surface glass plate are fused and joined in at least a part of a peripheral portion of the glass plates, and pressure between the front surface glass plate and the back surface glass plate is reduced to below atmospheric pressure.

According to the present invention, it is possible to provide a photoelectric converter device in which ingress of moisture and the like from the external environment is prevented and long-term reliability of the device is enhanced.

Further, according to the present invention, it is possible to provide a photoelectric converter device in which breakage and corrosion of the device due to expansion and contraction of air remaining inside is prevented.

DETAILED DESCRIPTION

<Basic Structure>

Figure 1:
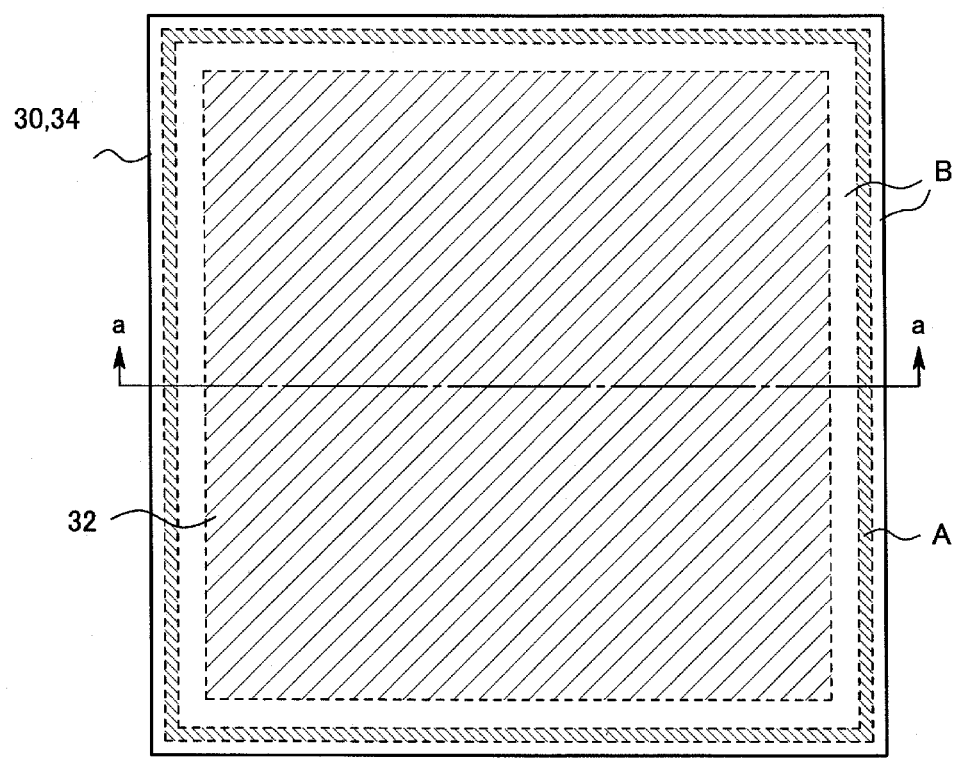
FIG. 1 is a front view showing a structure of a photoelectric converter device according to a first embodiment of the present invention.
Figure 2:
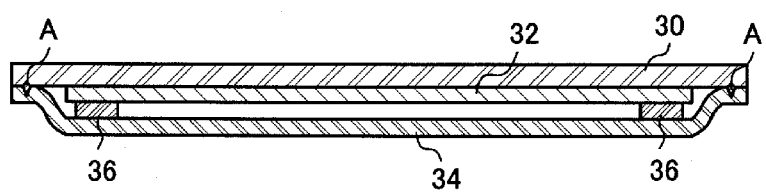
FIG. 2 is a cross-sectional view showing a structure of the photoelectric converter device according to the first embodiment of the present invention.

As shown in the front external view of FIG. 1 and the cross-sectional view of FIG. 2, a photoelectric converter device 200 according to a first embodiment of the present invention is configured including a front surface glass plate (glass substrate) 30, a photoelectric conversion unit 32, and a back surface glass plate 34. The photoelectric converter device 200 is an example structure for application to a thin-film silicon solar cell module. The cross-section shown in FIG. 2 is taken along line a-a in FIG. 1. In FIG. 2, for the purpose of clearly showing the respective components of the photoelectric converter device 200, the components are illustrated with thicknesses having ratios different from the actual ratios.

As the front surface glass plate 30, a glass plate having a length of 1 m, a width of 1 m, and a plate thickness of 4 mm may be employed, for example, without being limited thereto. Other structures are also possible so long as the plate is suitable for forming the photoelectric converter device 200 and is capable of mechanically supporting the photoelectric conversion unit 32. Incidence of light into the photoelectric converter device 200 basically occurs from the front surface glass plate 30 side.

The photoelectric conversion unit 32 is formed on the front surface glass plate 30. The photoelectric conversion unit 32 is formed by laminating components such as a transparent electrode, a photoelectric conversion unit, and a back surface electrode. The transparent electrode may be composed of a film made of one or a combination of a plurality of types of transparent conductive oxides (TCO) obtained by doping tin oxide ($SnO_2$), zinc oxide (ZnO), indium tin oxide (ITO) and the like with tin (Sn), antimony (Sb), fluorine (F), aluminum (Al), and the like. The photoelectric conversion unit may be an amorphous silicon photoelectric conversion unit (a-Si unit), a microcrystalline silicon photoelectric conversion unit (μc-Si unit), or the like. The photoelectric conversion unit may have a structure such as a tandem-type or triple-type structure formed by stacking a plurality of photoelectric conversion units. The back surface electrode may be composed of a transparent conductive oxide (TCO), a reflective metal, or a lamination of those materials. As the transparent conductive oxide (TCO), tin oxide ($SnO_2$), zinc oxide (ZnO), indium tin oxide (ITO), and the like are used. As the reflective metal, a metal such as silver (Ag), aluminum (Al), and the like is used.

The back surface glass plate 34 is provided so as to cover the photoelectric conversion unit 32 formed on the front surface glass plate 30. As the back surface glass plate 34, a glass plate having substantially identical planar dimensions as the front surface glass plate 30 and a plate thickness of 2 mm may be employed, for example, without being limited thereto.

The front surface glass plate 30 and the back surface glass plate 34 are fused and joined in a joint area A in their outer peripheral region. The joint area A is provided within a peripheral portion B where the photoelectric conversion unit 32 is not formed on the front surface glass plate 30. For example, the peripheral portion B (the portion in FIG. 1 where no hatching is marked) can be provided by removing, by means of laser or the like, the photoelectric conversion unit 32 once formed on the front surface glass plate 30. In order to fuse and join the front surface glass plate 30 and the back surface glass plate 34, the peripheral portion of at least one of the front surface glass plate 30 and the back surface glass plate 34 is preferably shaped in a curved state as shown in FIG. 2.

In the photoelectric converter device 200, interconnectors 36 may be provided for extracting power generated in the photoelectric conversion unit 32 to the outside. Here, since the film thickness of the photoelectric conversion unit 32 is several micrometers and the thickness of the interconnectors 36 is of the order of several hundred micrometers, so long as the width of the peripheral portion is approximately 10 mm or more, the four outer peripheral sides of the two glass plates can be configured to closely contact each other along the entire periphery by means of elastic deformation of the front surface glass plate 30 or the back surface glass plate 34, and to be fused and joined together in the joint area A.

Figure 3:
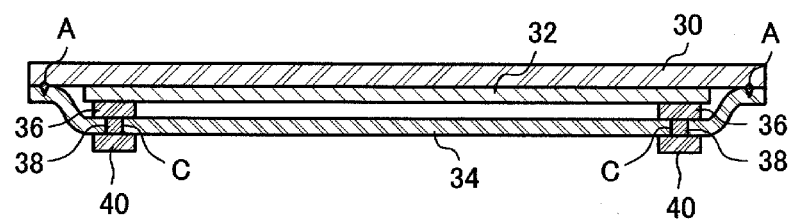
FIG. 3 is a cross-sectional view showing another example structure of the photoelectric converter device according to the first embodiment of the present invention.

The cross-sectional view of FIG. 3 illustrates an example structure for extracting generated power via the interconnectors 36. In this example structure, each opening C is created at a predetermined position in the back surface glass plate 34, and a wiring cord 38 that serves as a current path is placed through the opening. Further, a terminal box 40 is provided at a position overlapping the opening C, and the wiring cord 38 is connected to the terminal box 40. According to this arrangement, the opening C is covered by the terminal box 40, such that generated power can be extracted to the outside without impairing the sealing effect. The inside of the terminal box 40 may be filled with a butyl resin or the like to further ensure the sealed state. Further, it is possible to create the opening C on the front surface glass plate 30 side.

Figure 4:
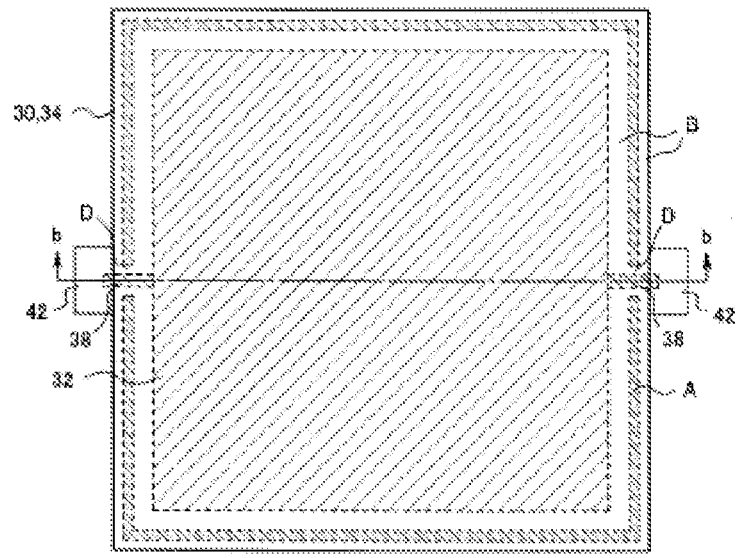
FIG. 4 is a front view showing another example structure of the photoelectric converter device according to the first embodiment of the present invention.
Figure 5:
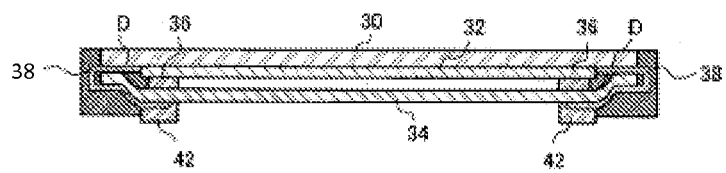
FIG. 5 is a cross-sectional view showing another example structure of the photoelectric converter device according to the first embodiment of the present invention.

The plan view of FIG. 4 and the cross-sectional view of FIG. 5 illustrate another example structure for extracting generated power. The cross-section shown in FIG. 5 is taken along line b-b in FIG. 4. In this example, a part of the outer peripheral portion of the front surface glass plate 30 and a part of the back surface glass plate 34 are not provided with the joint area A, but instead an opening D is provided. A wiring cord 38 that serves as a current path is placed through the opening D, and this part only is sealed with an end face sealing member 42. Although the part sealed with the end face sealing member 42 may tend to become a path for ingression of moisture and the like from the external environment, by minimizing the length of such part, reliability of the photoelectric converter device 200 is enhanced as compared to devices with conventional structures.

<Fusing and Joining Method>

Figure 6:
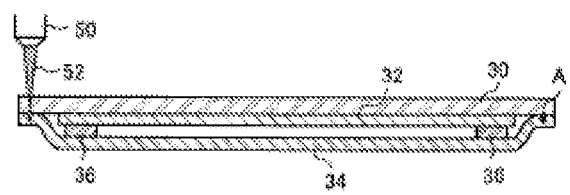
FIG. 6 is a diagram explaining a method for manufacturing the photoelectric converter device according to the first embodiment of the present invention.

FIG. 6 illustrates a method for fusing and joining the front surface glass plate 30 and the back surface glass plate 34 of the photoelectric converter device 200 in the joint area A.

As shown in FIG. 2, the peripheral portion of at least one of the front surface glass plate 30 and the back surface glass plate 34 is shaped in a curved state, so that the front surface glass plate 30 and the back surface glass plate 34 are placed in close contact with each other in the peripheral portion B. While in this state, a laser beam 52 is radiated from a laser device 50 by focusing at the closely-contacting surfaces in the peripheral portion B, and is scanned along the four outer peripheral sides of the front surface glass plate 30 and the back surface glass plate 34.

The laser beam 52 is preferably a femtosecond laser beam. In other words, the laser beam 52 preferably has a pulse width of one femtosecond or less. Further, the laser beam 52 preferably has a wavelength at which absorption occurs in at least one of the front surface glass plate 30 and the back surface glass plate 34. For example, the laser beam 52 preferably has a wavelength of 800 nm. Furthermore, the laser beam 52 is preferably radiated with energy intensity and scan speed that are sufficient for melting the front surface glass plate 30 and the back surface glass plate 34. For example, the laser beam 52 is preferably radiated with a pulse energy of 10 microjoules ($\mu J$) per pulse. Further, the laser beam 52 is preferably scanned at a scan speed of 60 mm per minute. The laser beam 52 may be radiated from either of the front surface glass plate 30 side and the back surface glass plate 34 side.

Figure 7:
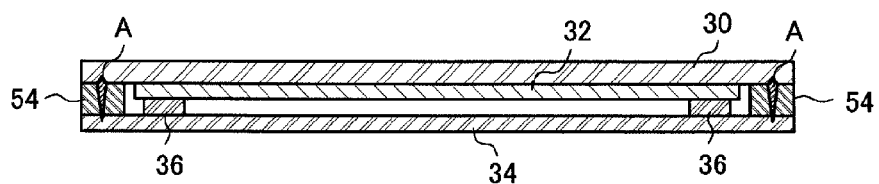
FIG. 7 is a cross-sectional view showing another example structure of the photoelectric converter device according to the first embodiment of the present invention.

In the case where the photoelectric conversion unit 32 and the interconnectors 36 have large thicknesses and the gap between the peripheral portions of the front surface glass plate 30 and the back surface glass plate 34 becomes large, a filler 54 may be filled in the gap as shown in the cross-sectional view of FIG. 7, and the front surface glass plate and the back surface glass plate 34 may be fused and joined by melting the filler 54.

As the filler 54, it is preferable to use a material containing elements that can fuse and join the front surface glass plate 30 and the back surface glass plate 34, such as Si, SiO, $SiO_2$, and $SiO_X$.

Figure 8:
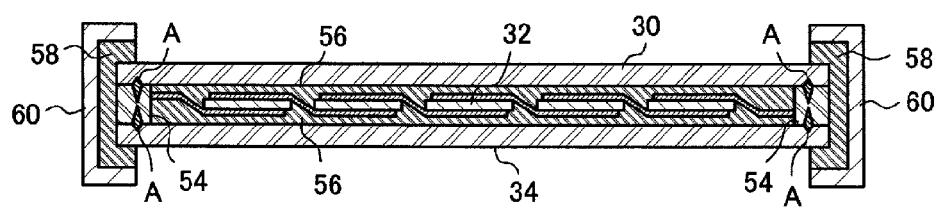
FIG. 8 is a cross-sectional view showing another example structure of the photoelectric converter device according to the first embodiment of the present invention.

Since the laser beam 52 can be radiated from either of the front surface glass plate 30 side and the back surface glass plate 34 side, in the case where the photoelectric conversion unit 32 itself (including the silicon substrate) has a large thickness as in the case of a crystalline silicon solar cell, it is possible to employ a configuration such that a front surface of the filler 54 and the front surface glass plate 30 are fused and joined, and a back surface of the filler 54 and the back surface glass plate 34 are fused and joined, as shown in FIG. 8.

In that case, in order to planarize the unevenness created by the photoelectric conversion unit 32, a conventional sealant 56 may be used concurrently. In addition, for increased sealing effect, the conventional end face seal 58 and frame 60 may also be used concurrently.

Figure 9:
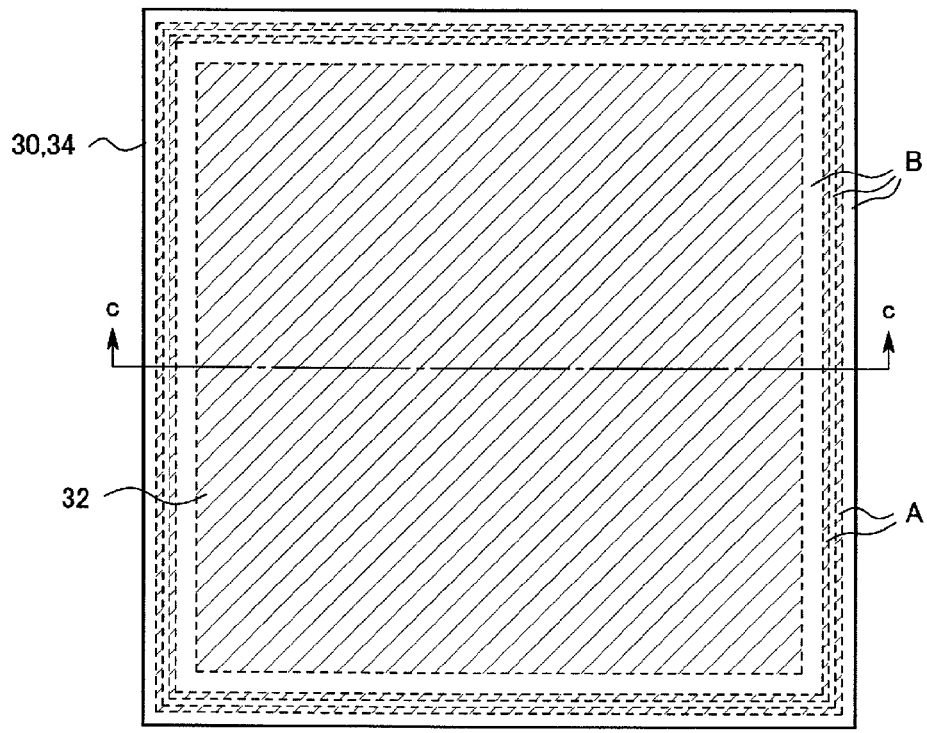
FIG. 9 is a front view showing another example structure of the photoelectric converter device according to the first embodiment of the present invention.
Figure 10:
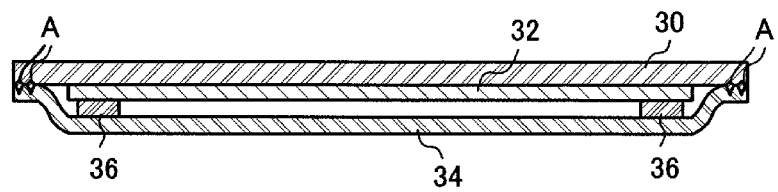
FIG. 10 is a cross-sectional view showing another example structure of the photoelectric converter device according to the first embodiment of the present invention.
Figure 11:
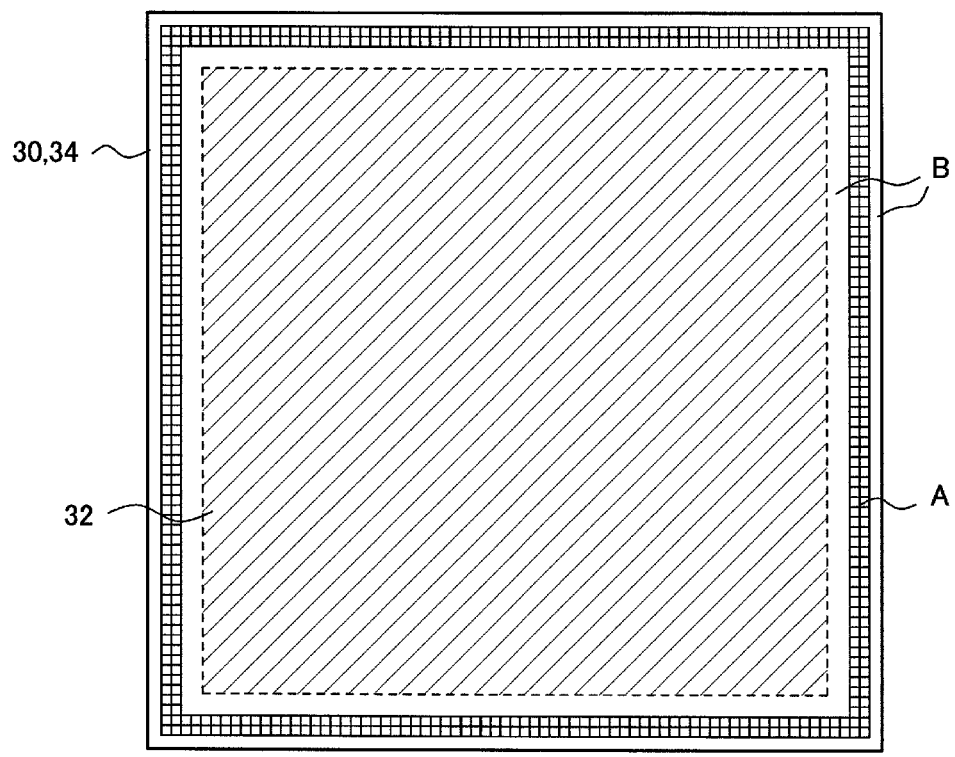
FIG. 11 is a front view showing another example structure of the photoelectric converter device according to the first embodiment of the present invention.
Figure 12:
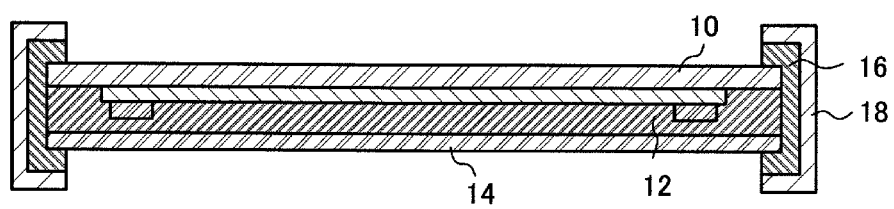
FIG. 12 is a cross-sectional view showing a structure of a conventional photoelectric converter device.
Figure 13:
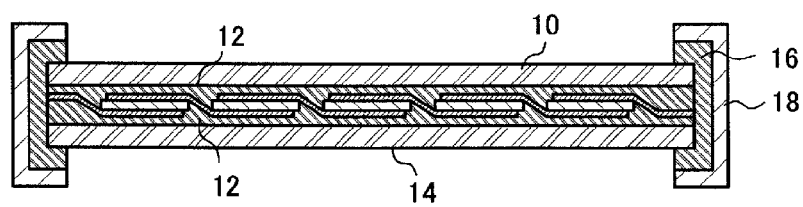
FIG. 13 is a cross-sectional view showing another example structure of the conventional photoelectric converter device.
Figure 14:
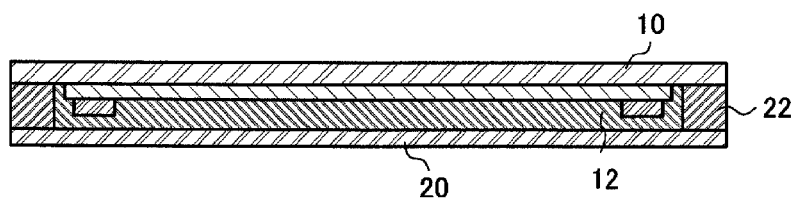
FIG. 14 is a cross-sectional view showing another example structure of the conventional photoelectric converter device.

The joint area A is not necessarily formed as a single line. Alternatively, as shown in the plan view of FIG. 9 and the cross-sectional view of FIG. 10, a plurality of joint areas A may be provided. By providing a plurality of joint areas A in parallel to each other as can be seen in FIGS. 9 and 10, it is possible to increase the joining strength between the front surface glass plate 30 and the back surface glass plate 34 and to enhance airtightness. Further, the joint area A may alternatively be provided in lattice form as shown in FIG. 11. For clarity of illustration, the joint area A in FIG. 11 is drawn in thin lines.

Figure 15:
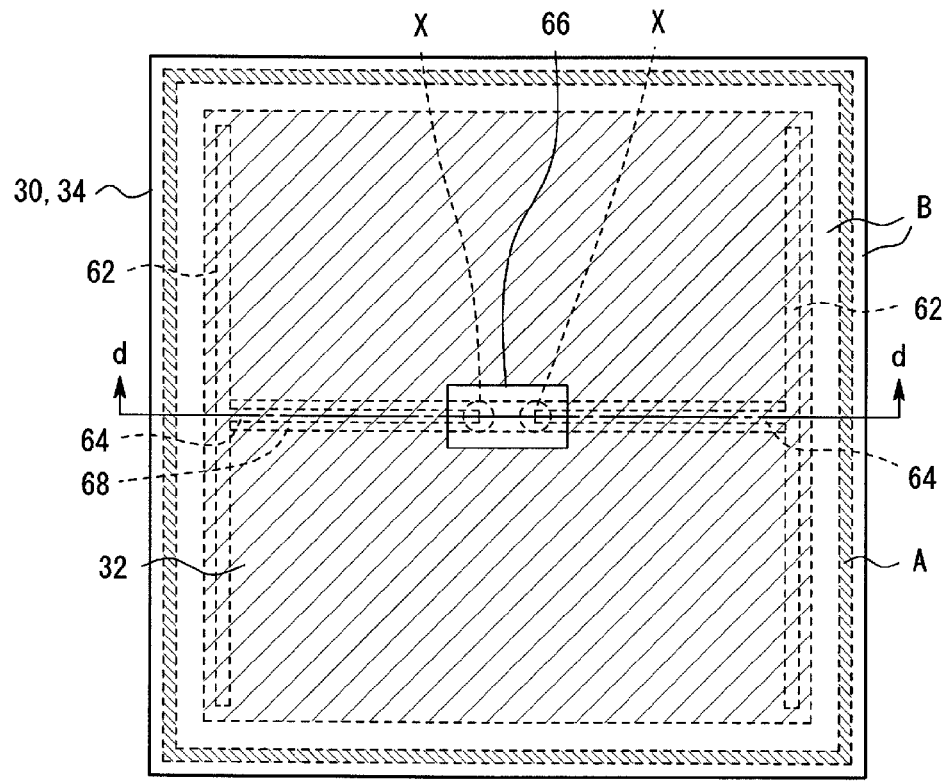
FIG. 15 is a front view showing another example structure of the photoelectric converter device according to the first embodiment of the present invention.
Figure 16:
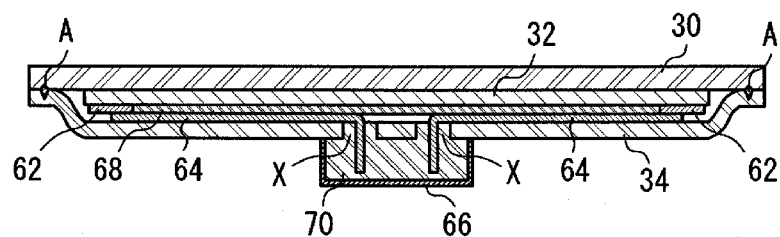
FIG. 16 is a cross-sectional view showing another example structure of the photoelectric converter device according to the first embodiment of the present invention.

The plan view of FIG. 15 and the cross-sectional view of FIG. 16 show another example structure for extracting generated power. The cross-section shown in FIG. 16 is taken along line d-d in FIG. 15. In this example, first collector wiring lines 62 and second collector wiring lines 64 are provided for extracting electric power generated in the photoelectric conversion unit 32. The first collector wiring lines 62 are wiring lines for collecting power from the photoelectric conversion unit 32 that is divided into parallel parts. The second collector wiring lines 64 are wiring lines connecting from the first collector wiring lines 62 to a terminal box 66.

The first collector wiring lines 62 are arranged on the back surface electrode of the photoelectric conversion unit 32. In the photoelectric converter device 200, the photoelectric conversion layer is divided into parallel parts each having a positive electrode and a negative electrode, and the first collector wiring lines 62 are formed near the side edges of the photoelectric converter device 200 so as to connect the positive electrodes to each other and the negative electrodes to each other. Accordingly, the first collector wiring lines 62 are arranged along a direction orthogonal to the parallel dividing direction of the photoelectric conversion layer. In this example, as can be seen in FIG. 15, the first collector wiring lines 62 are arranged at the left and right side edges and along the vertical direction in the figure. With this arrangement, the first collector wiring lines 62 connect, in parallel, the positive electrodes to each other and the negative electrodes to each other in the serially-connected photoelectric conversion unit 32.

Next, an insulating sheathing material 68 is disposed for providing electrical insulation between the second collector wiring lines 64 and the back surface electrode. As shown in FIGS. 15 and 16, the insulating sheathing material is arranged on the back surface electrode of the photoelectric conversion unit 32 so as to extend from positions near the first collector wiring lines 62 provided along the left and right side edges of the photoelectric converter device 200 to the central portion at which the terminal box 66 is arranged. Here, as can be seen in FIG. 15, the insulating sheathing material 68 extends in the lateral direction in the figure from positions near the left and right first collector wiring lines 62 toward the terminal box 66. The insulating sheathing material 68 is preferably composed of a material such as polyester (PE), polyethylene terephthalate (PET), polyethylene naphthalate (PEN), polyimide, or polyvinyl fluoride. Further, as the insulating sheathing material 68, it is preferable to use a member having an adhesive applied on the back surface as in a sticker.

As shown in FIGS. 15 and 16, the second collector wiring lines 64 are arranged on and along the insulating sheathing material 68 to extend from positions overlapping the left and right first collector wiring lines 62 toward the central portion of the photoelectric converter device 200. The insulating sheathing material 68 is sandwiched between the second collector wiring lines 64 and the back surface electrode of the photoelectric conversion unit 32, such that electrical insulation is maintained between the second collector wiring lines 64 and the back surface electrode. Meanwhile, first ends of the second collector wiring lines 64 are extended to overlap the first collector wiring lines 62, and are electrically connected to the first collector wiring lines 62. For example, it is preferable to electrically connect the second collector wiring lines 64 to the first collector wiring lines 62 by ultrasonic soldering or the like. The other ends of the second collector wiring lines 64 are electrically connected to electrode terminals inside the terminal box 66, which is described below.

The back surface of the photoelectric converter device 200 is sealed with the back surface glass plate 34. When carrying out this sealing, ends of the second collector wiring lines 64 are drawn out through holes X created in the back surface glass plate 34 near the mounting position of the terminal box 66. Then, the ends of the second collector wiring lines 64 are electrically connected by soldering or the like to terminal electrodes inside the terminal box 66. Further, the space inside the terminal box 66 is filled with an insulating resin 70 such as silicone, and the terminal box 66 is closed off. Preferably, the terminal box 66 is mounted by being affixed, using silicone or the like, to a position near the holes X for drawing out the ends of the second collector wiring lines 64.

The front surface glass plate 30 and the back surface glass plate 34 are fused and joined in the joint area A in their outer peripheral region. The joint area A is provided within the peripheral portion B where the photoelectric conversion unit 32 is not formed on the front surface glass plate 30. For example, the peripheral portion B (the portion in FIG. 1 where no hatching is marked) can be provided by removing, by means of a laser or the like, the photoelectric conversion unit 32 once formed on the front surface glass plate 30. In order to fuse and join the front surface glass plate 30 and the back surface glass plate 34, the peripheral portion of at least one of the front surface glass plate 30 and the back surface glass plate 34 is preferably shaped in a curved state as shown in FIG. 16.

Second Embodiment

Figure 17:
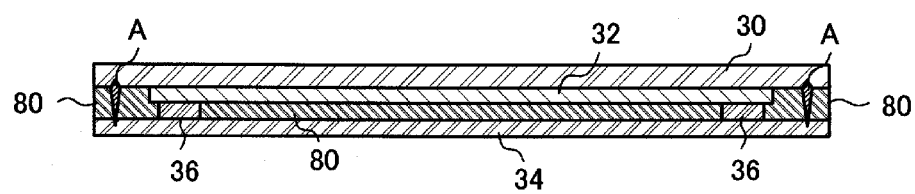
FIG. 17 is a cross-sectional view showing a structure of a photoelectric converter device according to a second embodiment of the present invention.

As shown in the cross-sectional view of FIG. 17, a photoelectric converter device 300 according to a second embodiment is configured including a sealant 80 in addition to the front surface glass plate 30, the photoelectric conversion unit 32, and the back surface glass plate 34. In FIG. 17, for the purpose of clearly showing the respective components of the photoelectric converter device 300, the components are illustrated with thicknesses having ratios different from the actual ratios.

In the photoelectric converter device 300, before covering the photoelectric conversion unit 32 with the back surface glass plate 34, the sealant 80 is applied on the back surface of the photoelectric conversion unit 32. Subsequently, after sintering, the back surface glass plate 34 is positioned in the covering state.

The sealant 80 is preferably a material having a coefficient of thermal expansion that is close to those of the front surface glass plate 30 and the back surface glass plate 34, and a silicon oxide material is preferably used. Desirably, the silicon oxide material contains $SiO$, $SiO_2$, or $SiO_X$ by 50% or more, as the main component. By configuring the sealant 80 with a silicon oxide material, its coefficient of thermal expansion can be made close to those of the front surface glass plate 30 and the back surface glass plate 34, such that generation of thermal stress between the front surface glass plate 30 or the back surface glass plate 34 and the sealant 80 due heating by solar radiation and the like can be suppressed. Accordingly, it is possible to prevent breakage of the front surface glass plate 30 and the back surface glass plate 34 as well as the sealant 80 due to thermal stress.

For example, a silica sol (silica gel) prepared by mixing fine particles of silicon oxide (glass) into an acrylic or other resin binder or a solvent such as water or organic solvent is applied by a spray coating method, a spin coating method, or the like. Subsequently, the sealant 80 is solidified by heating at a temperature in the range from several ten C.° to several hundred C.°. After that, the back surface glass plate 34 is positioned in the covering state, and the front surface glass plate 30 and the back surface glass plate 34 are joined.

As described above, at least a part of the gap created between the front surface glass plate 30 and the back surface glass plate 34 due to components such as the collector wiring lines and the insulating sheathing material is filled by the silicon oxide sealant 80. With this arrangement, air in the gap present between the front surface glass plate 30 and the back surface glass plate 34 is eliminated, so that influences due to air expansion and contraction can be suppressed, thereby preventing breakage of the front surface glass plate and the back surface glass plate 34. Further, it is possible to prevent water ingress via the gap between the front surface glass plate 30 and the back surface glass plate 34.

Figure 21:
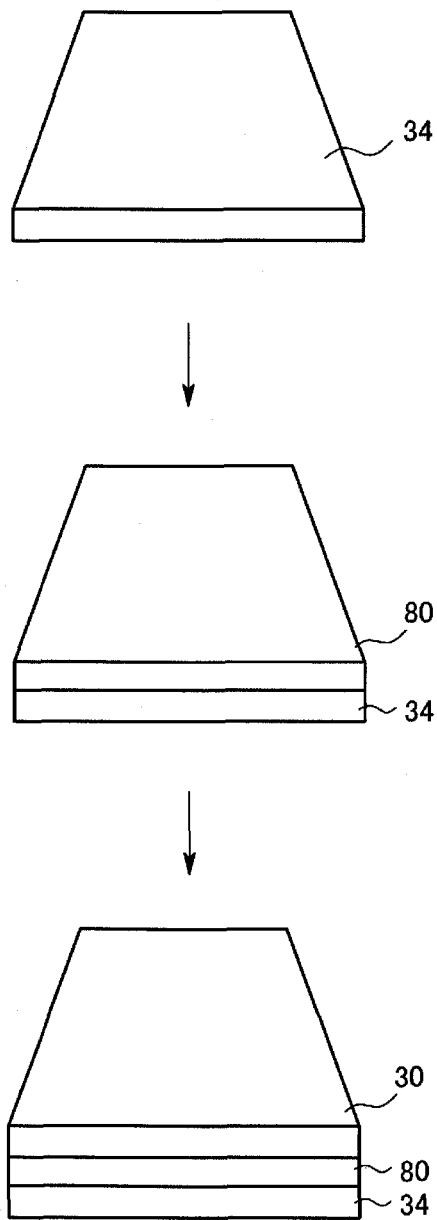
FIG. 21 is a diagram explaining a method for manufacturing the photoelectric converter device according to the third embodiment of the present invention.

An experiment was conducted as shown in FIG. 21. Specifically, the back surface glass plate 34 was coated with a glass frit that can serve as the sealant 80, which was prepared by kneading together silicon oxide (glass) powder and a cellulosic resin. After pre-sintering at 200 C.°, the test piece was covered with the front surface glass plate 30 (a dummy sample without having the photoelectric conversion unit formed thereon), and a laser beam having a frequency of 976 nm and an output of 24 W was radiated along the outer periphery at a scan speed of 300 mm/s.

By performing the sealing process under these conditions and examining under an optical microscope, it was confirmed that the front surface glass plate 30 and the back surface glass plate 34 were completely fused and joined via the sealant 80.

Further, another test piece was prepared in which, before being sealed according to the above-described method, a humidity indicator substance which changes color upon absorbing moisture was inserted between the front surface glass plate 30 and the back surface glass plate 34, and then the fusing and joining process was completed according to the above-described method. Observations of this test piece were made in the initial state and after performing a high temperature and high humidity test (i.e., after leaving to stand under a temperature of 85 C.° and a relative humidity of 85%) for 1000 hours. No color change of the humidity indicator substance was observed after the high temperature and high humidity test, and therefore it was demonstrated that high airtightness is maintained between the front surface glass plate 30 and the back surface glass plate 34.

FIG. 17 shows an example of the photoelectric converter device 300 according to the second embodiment. This example has a structure in which the sealant 80 is coated on the entire surface of the side of the front surface glass plate on which the photoelectric conversion unit 32 is formed. In this example, after the back surface glass plate 34 is positioned in the covering state, in the outer peripheral portion of the photoelectric converter device 300, the front surface of the sealant 80 and the front surface glass plate 30 may be fused and joined, and the back surface of the sealant 80 and the back surface glass plate 34 may be fused and joined.

By adopting this structure, it is possible to perform the fusing and joining process without largely curving either of the front surface glass plate 30 and the back surface glass plate 34. As such, bending stress applied to the front surface glass plate 30 and the back surface glass plate 34 can be reduced, thereby preventing breakage of the front surface glass plate 30 and the back surface glass plate 34.

Figure 18:
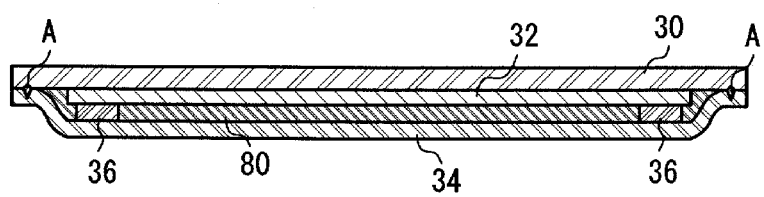
FIG. 18 is a cross-sectional view showing another example structure of the photoelectric converter device according to the second embodiment of the present invention.

FIG. 18 shows another example of the photoelectric converter device 300 according to the second embodiment. This example has a structure in which the sealant 80 is coated on the side of the front surface glass plate 30 on which the photoelectric conversion unit 32 is formed, while leaving the outer peripheral portion uncoated. In this example, after the back surface glass plate 34 is positioned in the covering state, the front surface glass plate 30 and the back surface glass plate 34 are fused and joined while the peripheral portion of at least one of the front surface glass plate 30 and the back surface glass plate 34 is shaped in a curved state. Preferably, the joint area is the peripheral portion where the photoelectric conversion unit 32 is not formed on the front surface glass plate 30.

In this example, as the front surface glass plate 30 and the back surface glass plate 34 are directly fused and joined to each other, high joining strength can be achieved. Further, as the front surface glass plate 30 and the back surface glass plate 34 are urged against each other by the curving of the front surface glass plate 30 or the back surface glass plate 34, the closely-contacting property between the front surface glass plate 30 and the back surface glass plate 34 can be enhanced. With this arrangement, air in the gap between the front surface glass plate 30 and the back surface glass plate 34 can be further eliminated, so that breakage of the front surface glass plate 30 and the back surface glass plate 34 caused by air expansion and contraction can be prevented more effectively. Further, it is also possible to further minimize water ingress via the gap between the front surface glass plate 30 and the back surface glass plate 34.

The structures shown in FIGS. 17 and 18 can be applied to a configuration in which the wiring cord 38 is drawn out from the opening D in the peripheral portion as in the photoelectric converter device 100 shown in FIG. 5. In this case, the sealant 80 may also be applied to the area of the opening D so that the sealant 80 simultaneously seals the opening D.

Figure 19:
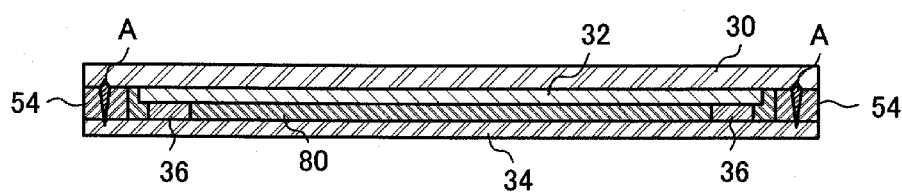
FIG. 19 is a cross-sectional view showing another example structure of the photoelectric converter device according to the second embodiment of the present invention.

FIG. 19 shows another example of the photoelectric converter device 300 according to the second embodiment. This example has a structure in which the sealant 80 is coated on the side of the front surface glass plate 30 on which the photoelectric conversion unit 32 is formed while leaving the outer peripheral portion uncoated, then the filler 54 is filled between the front surface glass plate 30 and the back surface glass plate 34, and the front surface glass plate 30 and the back surface glass plate 34 are fused and joined by melting the filler 54.

In this structure, as in the example shown in FIG. 17, bending stress applied to the front surface glass plate 30 and the back surface glass plate 34 can be reduced, thereby preventing breakage of the front surface glass plate 30 and the back surface glass plate 34. The configuration in which the filler 54 and the sealant 80 are concurrently used can also be applied to a module for a photoelectric conversion unit 32 having a large thickness as in the case of a crystalline silicon solar cell shown in FIG. 8.

In the examples of FIGS. 18 and 19, it is also preferable to position the back surface glass plate 34 in the covering state before the sealant 80 is completely solidified. By sealing while the sealant 80 is in a highly fluid state, it is possible to further increase the filling rate of the sealant 80 at the peripheral portion, in the gap between the front surface glass plate 30 and the back surface glass plate 34, and in any gap created between the filler 54 and the sealant 80.

The same effect as the above can be achieved by first completely solidifying the sealant 80 in areas of the photoelectric converter device 300 other than the peripheral portion, then newly applying the sealant 80 to only the peripheral portion, and positioning the back surface glass plate 34 in the covering state while the sealant 80 is maintained in an incompletely solidified state.

Third Embodiment

A photoelectric converter device 400 according to a third embodiment has a configuration identical to the photoelectric converter device 100 according to the first embodiment, except that air in the gap between the front surface glass plate 30 and the back surface glass plate 34 is evacuated so as to attain a state of reduced pressure with respect to atmospheric pressure.

Figure 20:
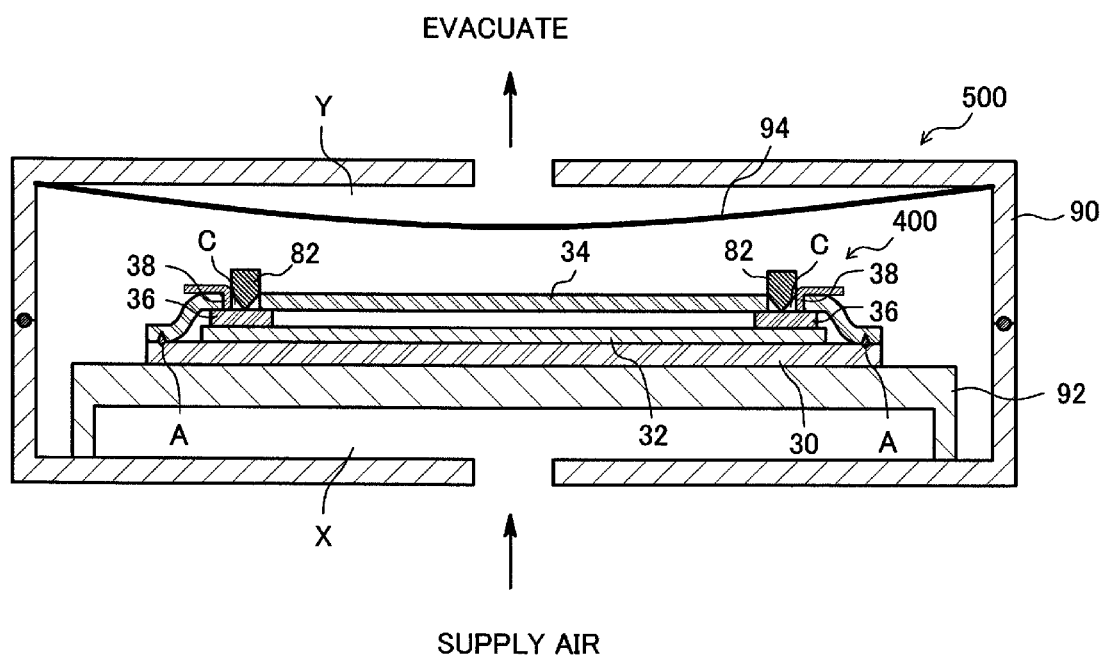
FIG. 20 is a diagram explaining a method for manufacturing a photoelectric converter device according to a third embodiment of the present invention.

FIG. 20 shows a laminator apparatus 500 for the photoelectric converter device 400. The laminator apparatus 500 is configured to include a chamber 90, a heater 92, and a diaphragm 94. The laminator apparatus 500 has a structure in which an upper region Y and a lower region X are partitioned by the elastic diaphragm 94. The heater 92 for placing the photoelectric converter device 400 thereon and for heating the photoelectric converter device 400 is provided in the lower region X of the chamber 90.

When carrying out lamination of the photoelectric converter device 400, after the front surface glass plate 30 and the back surface glass plate 34 are fused and joined in the joint area A, the device is placed on the heater 92 with a sealing member 82 being arranged in the opening C for the wiring cord 38 of the interconnector 36, as shown in FIG. 20. The sealing member 82 is preferably a butyl resin, for example. More specifically, the photoelectric converter device 400 is placed on the heater 92 while air or the like is supplied to the lower region X of the chamber 90 and the upper region Y is evacuated so that the diaphragm 94 is pulled upward. Subsequently, the photoelectric converter device 400 is heated by the heater 92, and at the same time, as shown in FIG. 21, by evacuating the lower region X of the laminator apparatus 500 and supplying air or the like to the upper region Y, the diaphragm 94 causes the sealing member 82 to be urged against the opening C. As a result, the sealing member 82 softened by heating is pushed against the opening C, and the sealing member 82 deforms in accordance with the shape of the opening C and seals the opening C.

At that time, air remaining in the gap between the front surface glass plate 30 and the back surface glass plate 34 is simultaneously evacuated, and the sealing is completed while the pressure in the gap between the front surface glass plate 30 and the back surface glass plate 34 is in a reduced state as compared to atmospheric pressure.

As described above, it is possible to attain a state in which air in the gap created between the front surface glass plate 30 and the back surface glass plate 34 due to the collector wiring lines and the insulating sheathing material is evacuated. Accordingly, influences due to air expansion and contraction can be suppressed, thereby preventing breakage of the front surface glass plate 30 and the back surface glass plate 34. Further, it is possible to prevent water ingress via the gap between the front surface glass plate 30 and the back surface glass plate 34.

The configuration for completing the sealing while air in the gap between the front surface glass plate 30 and the back surface glass plate 34 is evacuated can be similarly applied to the structure of FIG. 4 in which the wiring cords are drawn out from the peripheral portion of the photoelectric converter device, as well as to the structure of FIG. 15 in which the wiring cords 38 are drawn out from the central portion of the photoelectric converter device.

While the above-described third embodiment is configured such that air between the front surface glass plate 30 and the back surface glass plate 34 is evacuated via the opening C for drawing out the wiring cord 38 to the outside and the opening C is sealed in the evacuated state, other configurations are also possible. For example, the photoelectric converter device may be provided with a separate opening other than that for drawing out the wiring cord 38 to the outside, and air between the front surface glass plate 30 and the back surface glass plate 34 may be evacuated from that separate opening when completing the sealing using the sealing member 82.

What is claimed is:

1. A photoelectric converter device, comprising:
a first glass plate;
a photoelectric conversion unit formed on the first glass plate;
and a second glass plate arranged so as to cover the photoelectric conversion unit;
wherein the first glass plate and the second glass plate are fused and joined in at least a part of a peripheral portion of the glass plates;
wherein a plurality of joint areas are provided at the peripheral portion of the first glass plate and the second glass plate;
wherein the plurality of joint areas comprise an area including double lines, a first line provided at the peripheral portion and a second line provided outside the first line at the peripheral portion, the first and second lines establishing concentric joint areas; and
wherein the first glass plate and the second glass plate are directly fused and joined to each other, without using a sealant, along the peripheral portion of the first glass plate and the second glass plate.

2. The photoelectric converter device according to claim 1, wherein a gap between the first glass plate and the second glass plate is filled with a filler containing at least one of Si, SiO, SiO2, and SiOX, and the first glass plate and the second glass plate are fused and joined in at least a part of the peripheral portion of the glass plates via the filler.

3. The photoelectric converter device according to claim 1, wherein a wiring line connecting to the photoelectric conversion unit is arranged via a part of the peripheral portion of the first glass plate and the second glass plate which is not fused and joined.

4. The photoelectric converter device according to claim 2, wherein a wiring line connecting to the photoelectric conversion unit is arranged via a part of the peripheral portion of the first glass plate and the second glass plate which is not fused and joined.

5. The photoelectric converter device according to claim 1, wherein the peripheral portion of the first glass plate and the second glass plate is fused and joined along the entire peripheral portion, and an opening is provided in at least one of the first glass plate and the second glass plate, and a wiring line connecting to the photoelectric conversion unit is arranged via the opening.

6. The photoelectric converter device according to claim 2, wherein the peripheral portion of the first glass plate and the second glass plate is fused and joined along the entire peripheral portion, and an opening is provided in at least one of the first glass plate and the second glass plate, and a wiring line connecting to the photoelectric conversion unit is arranged via the opening.

7. The photoelectric converter device according to claim 1, wherein the first glass plate and the second glass plate are fused with at least one of the first glass plate and the second glass plate being shaped in a curved state at a peripheral portion.

8. The photoelectric converter device according to claim 1, wherein the first glass plate and the second glass plate are directly fused and joined to each other, with at least one of the first glass plate and the second glass plate being shaped in a curved state.

9. A photoelectric converter device, comprising:
a first glass plate;
a photoelectric conversion unit formed on the first glass plate;
a second glass plate arranged so as to cover the photoelectric conversion unit;
and a sealant composed of a silicon oxide material and filling up at least a part of a gap present between the first glass plate and the second glass plate, wherein the first glass plate and the second glass plate are fused and joined in at least a part of a peripheral portion of the glass plates;
wherein a plurality of joint areas are provided at the peripheral portion of the first glass plate and the second glass plate;
wherein the plurality of joint areas comprise an area including double lines, a first line provided at the peripheral portion and a second line provided outside the first line at the peripheral portion, the first and second lines establishing concentric joint areas; and wherein the first glass plate and the second glass plate are directly fused and joined to each other, without using a sealant, along the peripheral portion of the first glass plate and the second glass plate.

10. The photoelectric converter device according to claim 9, wherein the first glass plate and the second glass plate are fused and joined via the sealant.

11. The photoelectric converter device according to claim 9, wherein the first glass plate and the second glass plate are fused with at least one of the first glass plate and the second glass plate being shaped in a curved state at a peripheral portion.

12. The photoelectric converter device according to claim 9, wherein the first glass plate and the second glass plate are directly fused and joined to each other, with at least one of the first glass plate and the second glass plate being shaped in a curved state.

13. A photoelectric converter device comprising:
a first glass plate;
a sealant disposed on the first glass plate except for a peripheral portion of the first glass plate;
a photoelectric conversion unit disposed on the first glass plate via the sealant; and
a second glass plate positioned to cover the photoelectric conversion unit,
wherein the first glass plate and the second glass plate are directly fused and joined to each other along the peripheral portion of the first glass plate and the second glass plate,
wherein a plurality of joint areas are provided at the peripheral portion of the first glass plate and the second glass plate; and
wherein the plurality of joint areas comprise an area including double lines, a first line provided at the peripheral portion and a second line provided outside the first line at the peripheral portion, the first and second lines establishing concentric joint areas.

14. The photoelectric converter device according to claim 13, wherein the first glass plate and the second glass plate are directly fused and joined to each other, with at least one of the first glass plate and the second glass plate being shaped in a curved state.

15. The photoelectric converter device according to claim 13, wherein the first glass plate and the second glass plate are fused and joined to each other in the plurality of joint areas along the peripheral portion of the first glass plate and the second glass plate, the plurality of joint areas comprising a first fused joint area and a second fused joint area located further toward outside than the first fused joint area.

16. The photoelectric converter device according to claim 13,
wherein the peripheral portion of the first glass plate and the second glass plate is fused and joined along the entire peripheral portion, and
an opening is provided in at least one of the first glass plate and the second glass plate, and a wiring line connecting to the photoelectric conversion unit is arranged via the opening.

* * * * *